US005691656A

United States Patent [19]
Sandusky

[11] Patent Number: 5,691,656
[45] Date of Patent: Nov. 25, 1997

[54] PRECISION (Nπ)/2 LATCHING PHASE DETECTOR

[75] Inventor: Randall L. Sandusky, Divide, Colo.

[73] Assignee: Texas Instruments Incorporated, Dallas, Tex.

[21] Appl. No.: 394,657

[22] Filed: Feb. 22, 1995

[51] Int. Cl.$^6$ .................................................. G01R 25/00
[52] U.S. Cl. .................................................. 327/7; 327/12
[58] Field of Search ........................................ 327/3, 7, 12

[56] References Cited

U.S. PATENT DOCUMENTS 5,196,804  3/1993  Oetzmann .................................. 327/7

*Primary Examiner*—Margaret Rose Wambach
*Attorney, Agent, or Firm*—W. Daniel Swayze, Jr.; W. James Brady, III; Richard L. Donaldson

[57] ABSTRACT

The present invention discloses a novel latching phase detector which eliminates prior art errors in phase detection due to DC and low frequency offsets present in reference and input signals. The invention also eliminates prior art errors in phase detection due to timing skews caused by unequal reference and input signal delay paths. The invention further eliminates the effects of logic element metastability. The invention comprises a reference signal differentiator and an input signal differentiator. Each differentiator has a corner frequency that is easily adjusted to block DC and low frequency offsets. The corner frequency can be adjusted to result in an nπ/2 phase detector where $1 \leq n \leq 4$. The invention also comprises an output latch that presents a delay path to the reference signal that is equal to the delay path presented to the input signal. The combined delay path experienced by the reference signal through the reference signal differentiator and the output latch is equal to the combined delay path experienced by the input signal through the input signal differentiator and the output latch. The output latch is also "race-free" and cannot enter a metastable condition.

12 Claims, 6 Drawing Sheets

(PHASE GREATER THAN 180°)

(PHASE LESS THAN 180°)

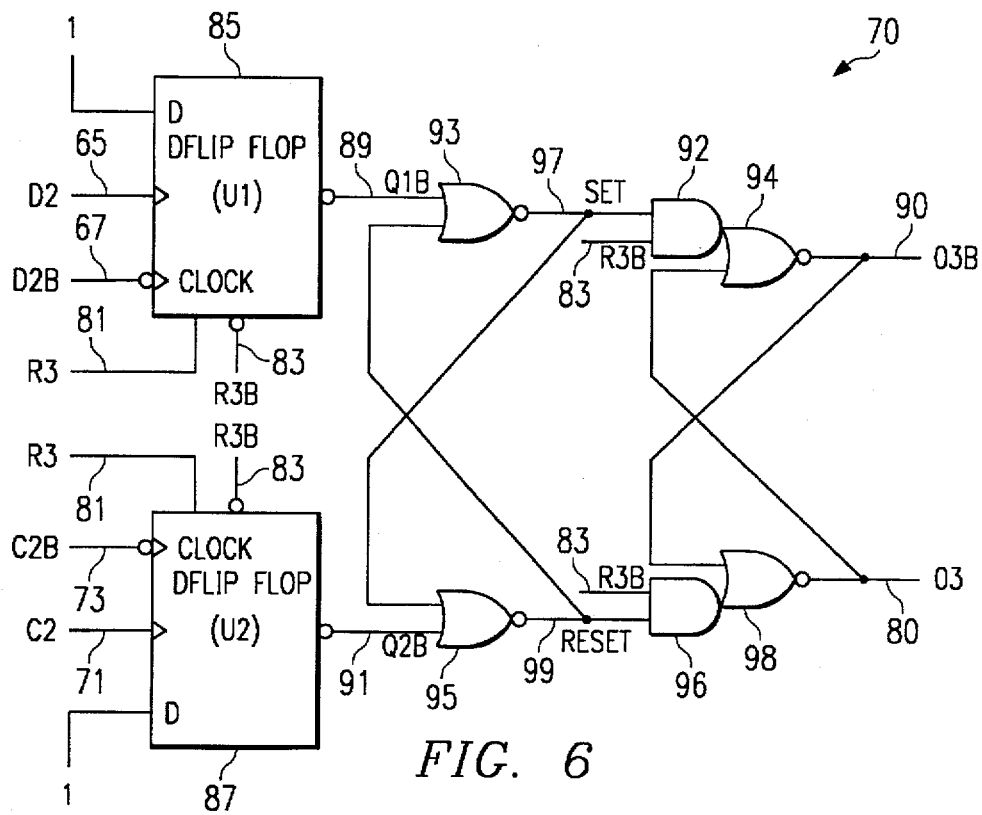
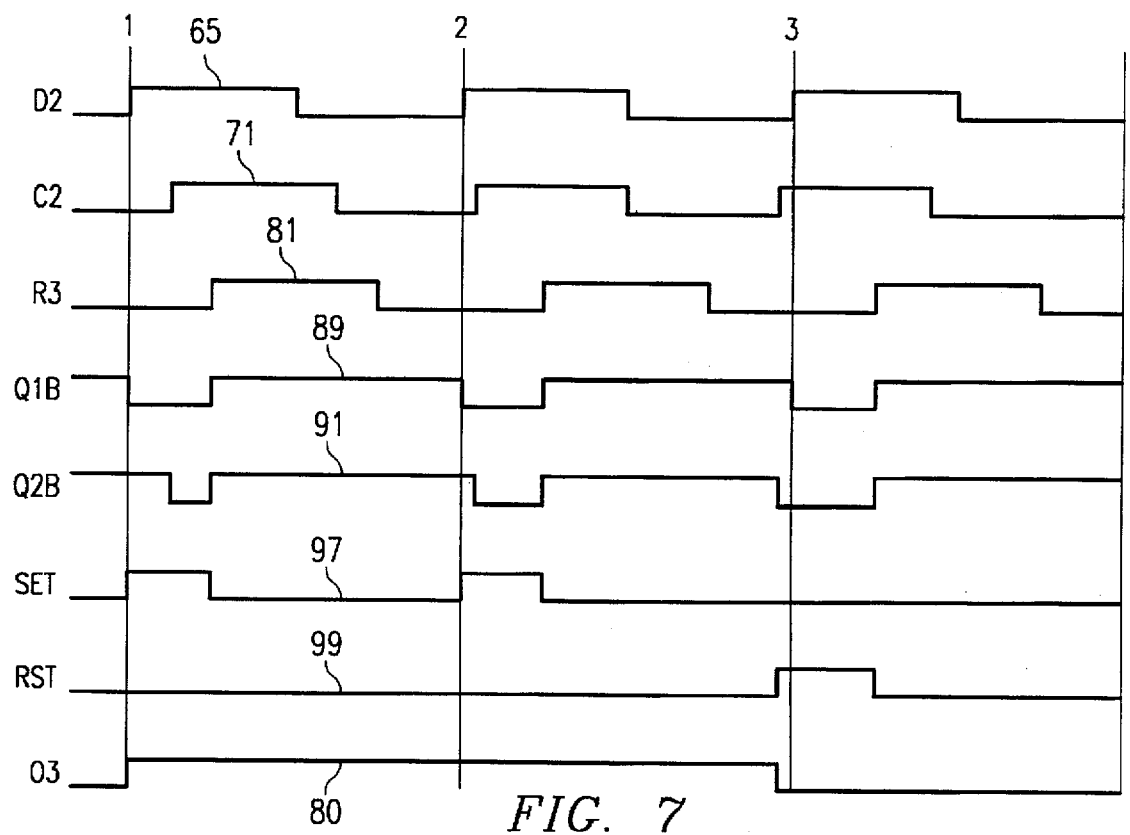
FIG. 6
FIG. 7

PRECISION (Nπ)/2 LATCHING PHASE DETECTOR

BACKGROUND OF THE INVENTION

1. Field of the Invention

The present invention relates to the field of detection of phase shifts. In particular, the invention relates to the field of detection and latching of the quadrature phase shift between an input signal of unknown phase and a reference signal.

2. Background Art

Quadrature phase points of a signal occur every $n\pi/2$ degrees where $1 \leq n \leq 4$. Accordingly, the 90° phase point is indicated by n=1, and the 180°, 270°, and 360° phase points by n=2, n=3, and n=4 respectively. Determining the phase relationship between the phase of an input signal and the quadrature phase points of a reference signal has application in fields such as phase locked loops, frequency synthesizers, and filter self-tuning circuits. In such applications, where the phase relationship between two incoherent signals is in question, it is important to determine whether the phase difference between the phase of an input signal and the quadrature phase points of a reference signal is greater or less than $n\pi/2$ degrees where $1 \leq n \leq 4$. FIG. 1A shows the quadrature phase points of a reference signal and its relationship to the phase of an input signal. In FIG. 1A, the input signal Vin (14) lags the reference signal Vref (12) by exactly $n\pi/2$ degrees (i.e. 90 degrees).

FIG. 1B is a block diagram of a quadrature phase detector (16) (also referred to as a phase detector, phase detecting means, or an $n\pi/2$ phase detector). Output signal Vout (18) is a representation of the phase difference between an input signal Vin (14) and a reference signal Vref (12). If n=1, Vout is forced to a logic "one" when the phase difference between the input signal Vin and the reference signal Vref is less than 90 degrees. If n=2, Vout is forced to a logic "one" when the phase difference between the input signal Vin and the reference signal Vref is less than 180 degrees. Likewise, when n=3 or n=4, Vout is forced to a logic "one" when the phase difference between the input signal Vin and the reference signal Vref is less than 270 or 360 degrees, respectively. Conversely, Vout will indicate a logic "zero" when the phase difference between Vin and Vref exceeds the quadrature phase point as specified by $(n\pi)/2$.

FIG. 2A shows a block diagram of a prior art quadrature latching phase detector where n=2 (accordingly the outputs of the phase detector indicate a difference of less than 180 degrees between the reference voltage Vref+ (22) and the input voltage Vin+ (26)). In FIG. 2A, Vref− (24) is the inverse of Vref+ (22); likewise, Vin− (28) is the inverse of Vin+ (26). FIG. 2B shows examples of waveforms Vref+ and Vref− applied to comparator CPref (30). The output of comparator CPref is V1 (34) whose waveform is shown in FIG. 2D. The output of comparator CPref (V1) is forced to logic "one" when Vref+ is greater than Vref−. Conversely, V1 is forced to logic "zero" when Vref+ is less than Vref−. Accordingly, at every signal crossing of Vref+ and Vref− the state of signal V1 is reversed from one to zero, or vice versa. Similarly, the Vin+ and Vin− inputs are shown in FIG. 2C as applied to comparator CPin (32). As shown in FIG. 2E, the output of comparator CPin (32) is forced to logic "one" when Vin+ is greater than Vin−, and to logic "zero" when Vin+ is less than Vin−. Thus, at every signal crossing of Vin+ and Vin− the state of signal V2 (36) is reversed from one to zero, or vice versa. In FIG. 2E the phase difference between signal V2 (representing the input signal in FIG. 2C) and signal V1 (representing the reference signal of FIG. 2B) is greater than 180 degrees. Accordingly, the phase detector output signal LT180 (40) is forced to logic "zero." In FIG. 2F, another representation of signal V2 is shown where the phase difference between signal V2 (representing the input signal) and signal V1 (representing the reference signal) is less than 180 degrees. Accordingly, the phase detector output signal LT180 is forced to logic "one."

Another example of a prior art latching phase detector is shown in FIG. 3. In this example, n is equal to one; accordingly the output of the phase detector GT90 indicates whether the phase difference between an input signal Vin' and a reference signal Vref' is more (or less) than 90 degrees. The timing diagrams of this phase detector are not shown to preserve simplicity. Both of these prior art phase detectors shown in FIG. 2A (where n=2) and FIG. 3 (where n=1), suffer from several disadvantages. First, for analog phase detectors such as that of FIG. 2A, DC and low frequency offsets which exist on the input or reference signals introduce a phase error in the output of the prior art phase detector. Since the 180° phase point is determined by the signal-crossings of the differential inputs, any offsets present in the signal will produce a duty cycle not equal to 50%. This causes a shift in the phase relationship between the reference and input signals which becomes significant as the input or reference signal amplitude decreases.

Second, the logic elements of the prior art phase detectors may have differing propagation delays causing a timing skew between the input and reference signal paths. The set-up and hold times of the flip flops also contribute to the sources of error, causing a phase shift error at the output of the detectors. For the prior art detector in FIG. 2A, it can be shown with basic mathematics that a one nano second set-up or hold time for flip flop 38 produces a 3.6° phase error for a 10 MHz signal. This error increases proportional to an increase in signal frequency.

Third, it is possible for the prior art phase detectors to suffer from metastability which can produce additional phase inaccuracies. This can be seen in FIG. 3 where the pulse at point A or B can become insufficient to energize SR latch 56 when the phase of signal Vin approaches the 90° phase point. When this occurs, SR latch 56 can enter a metastable state from which recovery is delayed, causing a phase error at the phase detector output.

The present invention utilizes a novel differentiation technique to overcome the disadvantages of the prior art phase detectors which result in an inaccurate determination of the phase relationship between an input and a reference signal. The invention eliminates phase shifts due to DC and low frequency offsets in reference and input signals. The invention also eliminates logic element race and metastable conditions of prior art phase detectors which result in erroneous determination of phase relationships.

SUMMARY OF THE INVENTION

The present invention discloses a novel latching phase detector which eliminates prior art errors in phase detection due to DC and low frequency offsets present in reference and input signals. The invention also eliminates prior art errors in phase detection due to timing skews caused by unequal reference and input signal delay paths. The invention further eliminates the effects of logic element metastability. The invention comprises a reference signal differentiator and an input signal differentiator. Each differentiator has a corner frequency that is easily adjusted to block DC and low frequency offsets. The corner frequency can be adjusted to result in an nπ/2 phase detector where 1≦n≦4. The invention also comprises an output latch that presents a delay path to the reference signal that is equal to the delay path presented to the input signal. The combined delay path experienced by the reference signal through the reference signal differentiator and the output latch is equal to the combined delay path experienced by the input signal through the input signal differentiator and the output latch. The output latch is also "race-free" and cannot enter a metastable condition.

BRIEF DESCRIPTION OF THE DRAWINGS

FIG. 6 illustrates an output latch according to the present invention.

FIG. 7 illustrates signal waveforms of the phase detector of the present invention.

DETAILED DESCRIPTION OF THE PRESENT INVENTION

A precision (nπ)/2 latching phase detector is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 1A:
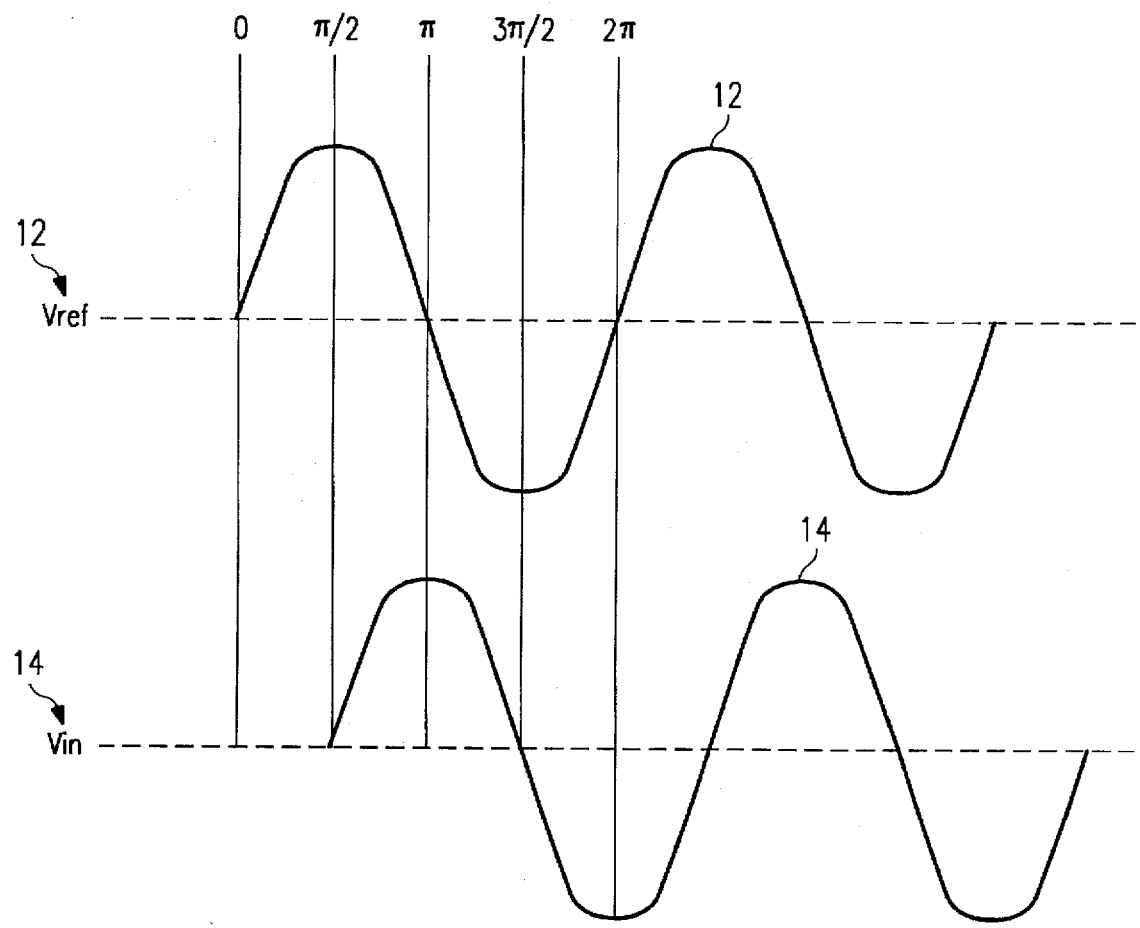
FIGS. 1A and 1B illustrate a reference signal and an input signal applied to a prior art phase detector.
Figure 1B:
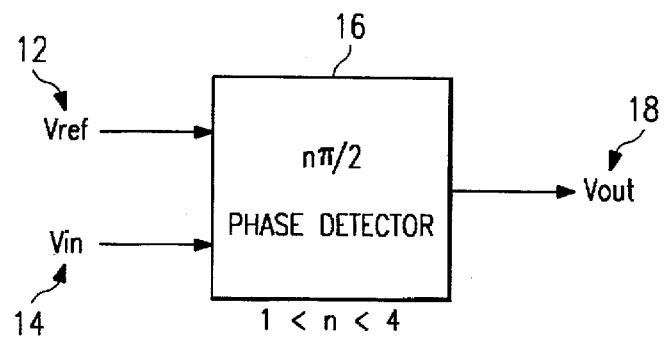
Figure 2A:
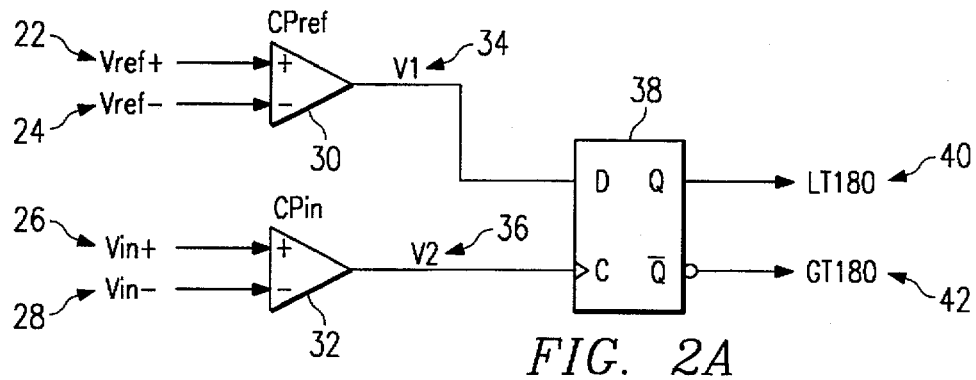
FIGS. 2A–2F illustrate a prior art nπ/2 latching phase detector where n=2.
Figure 2B:
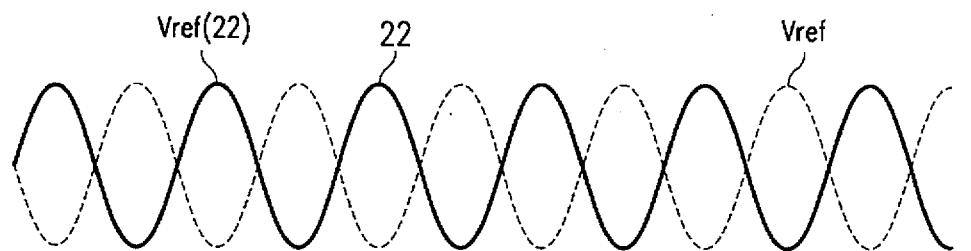
Figure 2C:
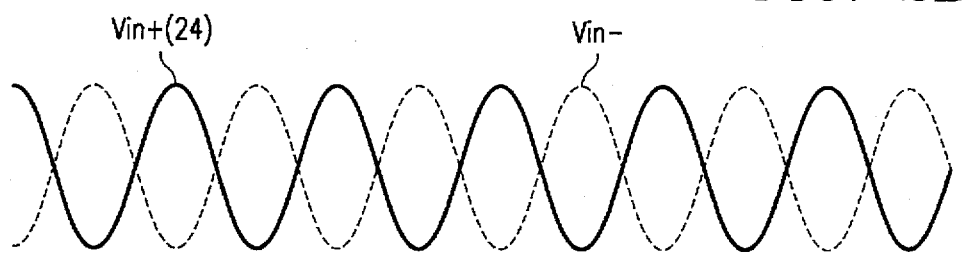
Figure 2D:
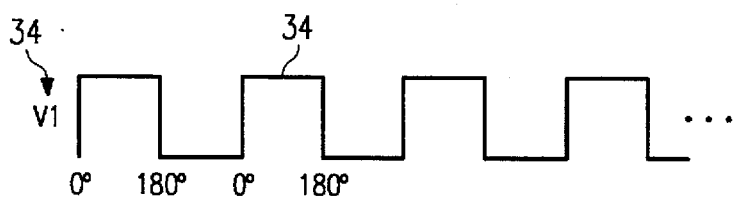
Figure 2E:
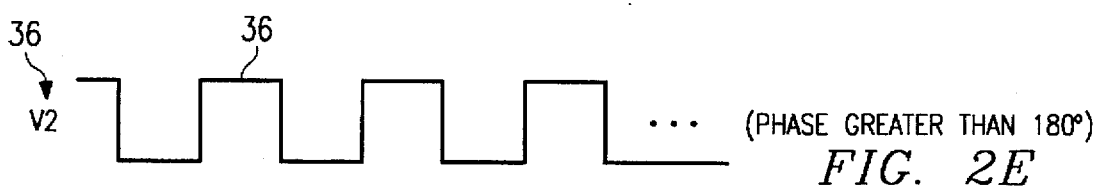
Figure 2F:
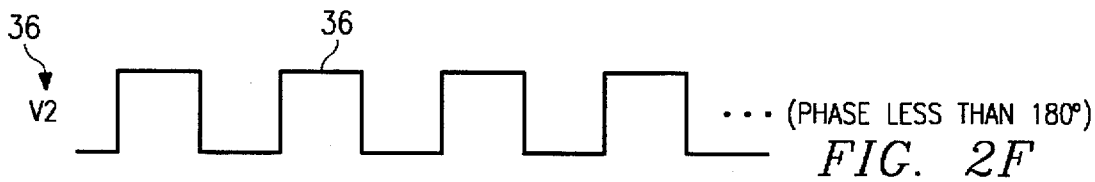
Figure 3:
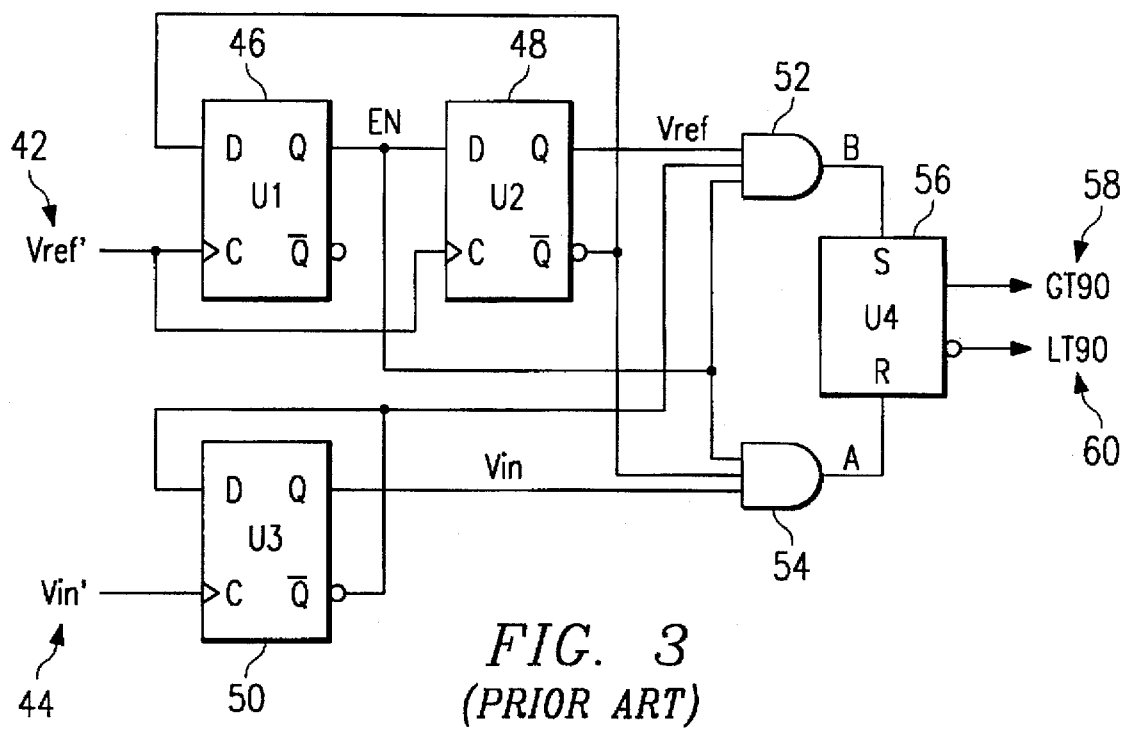
FIG. 3 shows a schematic diagram of a prior art nπ/2 latching phase detector where n=1.
Figure 4:
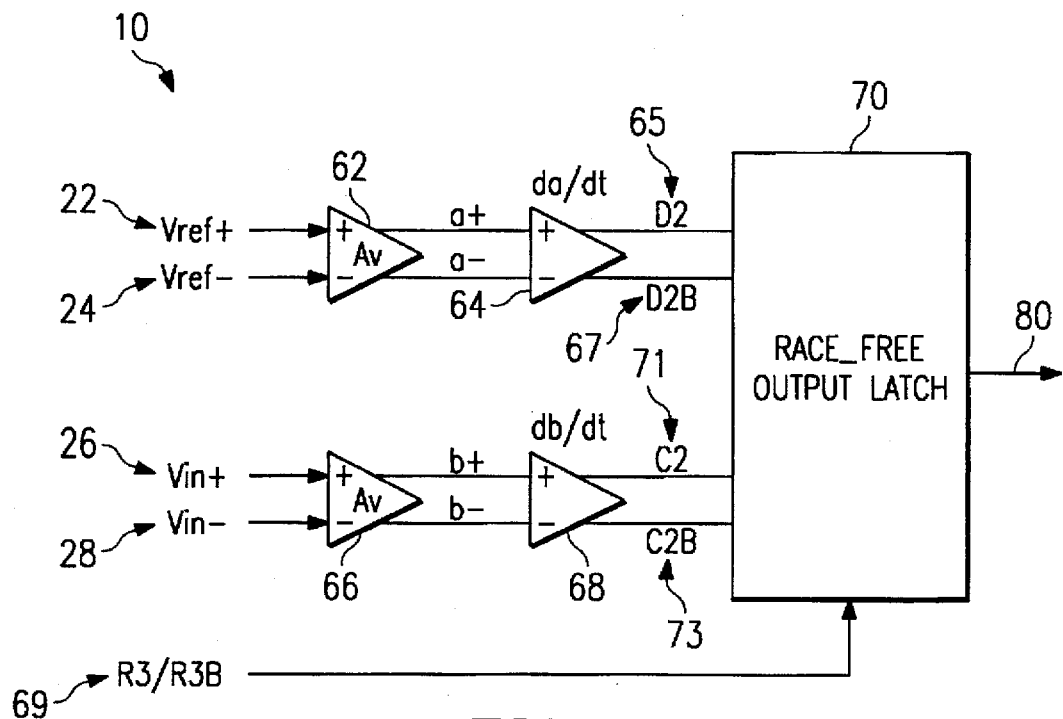
FIG. 4 shows a block diagram of the present invention's nπ/2 latching phase detector where n=2.

FIG. 4 shows a precision latching phase detector 10 according to the present invention. In the embodiment shown in FIG. 4, variable n is equal to 2. Accordingly, phase detector 10 detects whether the phase difference between a reference signal and an input signal is greater or less than 180 degrees. Also, as with the prior art phase detector shown in FIG. 2A, both the reference signal and the input signal to phase detector 10 are differential signals. A reference signal (Vref) is converted to differential form (i.e., Vref+ and Vref−) in a manner well known in the art. Likewise, an input signal (Vin) is converted to differential form (i.e., Vin+ and Vin−) in a manner well known in the art. The circuit necessary for these conversions is not shown to preserve simplicity.

Differential reference signals Vref+ (22) and Vref− (24) are amplified by differential amplifier 62. Differential amplifier 62 provides signals with magnitudes large enough to ensure adequate input levels for reference signal differentiator 64 (also referred to as the "reference differentiator"). The gain of differential amplifier 62 can be adjusted by the user as desired. Reference signal differentiator 64 typically includes a high pass filter. The proper setting of the corner frequency of the high pass filter results in elimination of DC or low frequency offset component of the reference signal. This avoids the disadvantage of the prior art phase detectors with respect to phase shifts caused by DC or low frequency offset of reference signals. Reference signal differentiator 64 also converts analog reference signals Vref+ and Vref− to digital output signals D2 (65) and D2B (67), respectively.

In a similar manner, differential input signals Vin+ (26) and Vin− (28) are amplified by differential amplifier 66. Differential amplifier 66 provides signals with magnitudes large enough to ensure adequate input levels for input signal differentiator 68 (also referred to as the "input differentiator"). The gain of differential amplifier 66 can be adjusted as desired. As with reference signal differentiator 64, input signal differentiator 68 includes a high pass filter. The proper setting of the corner frequency of the high pass filter eliminates DC or low frequency offset component of the input signal. This overcomes the disadvantage of the prior art's phase detectors with respect to phase shifts caused by DC or low frequency offset of input signals. Input signal differentiator 68 also converts analog input signals Vin+ and Vin− to digital output signals C2 (71) and C2B (73), respectively. The output of phase detector 10 is output 80 of output latch 70. Output 80 indicates whether the phase difference between Vref+ and Vin+ (or between Vref− and Vin−) is greater or less than 180 degrees. Output latch 70 is a "race-free" latch and, as such, output latch 70 eliminates the prior art race and metastable conditions that result in phase shifts.

Figure 5:
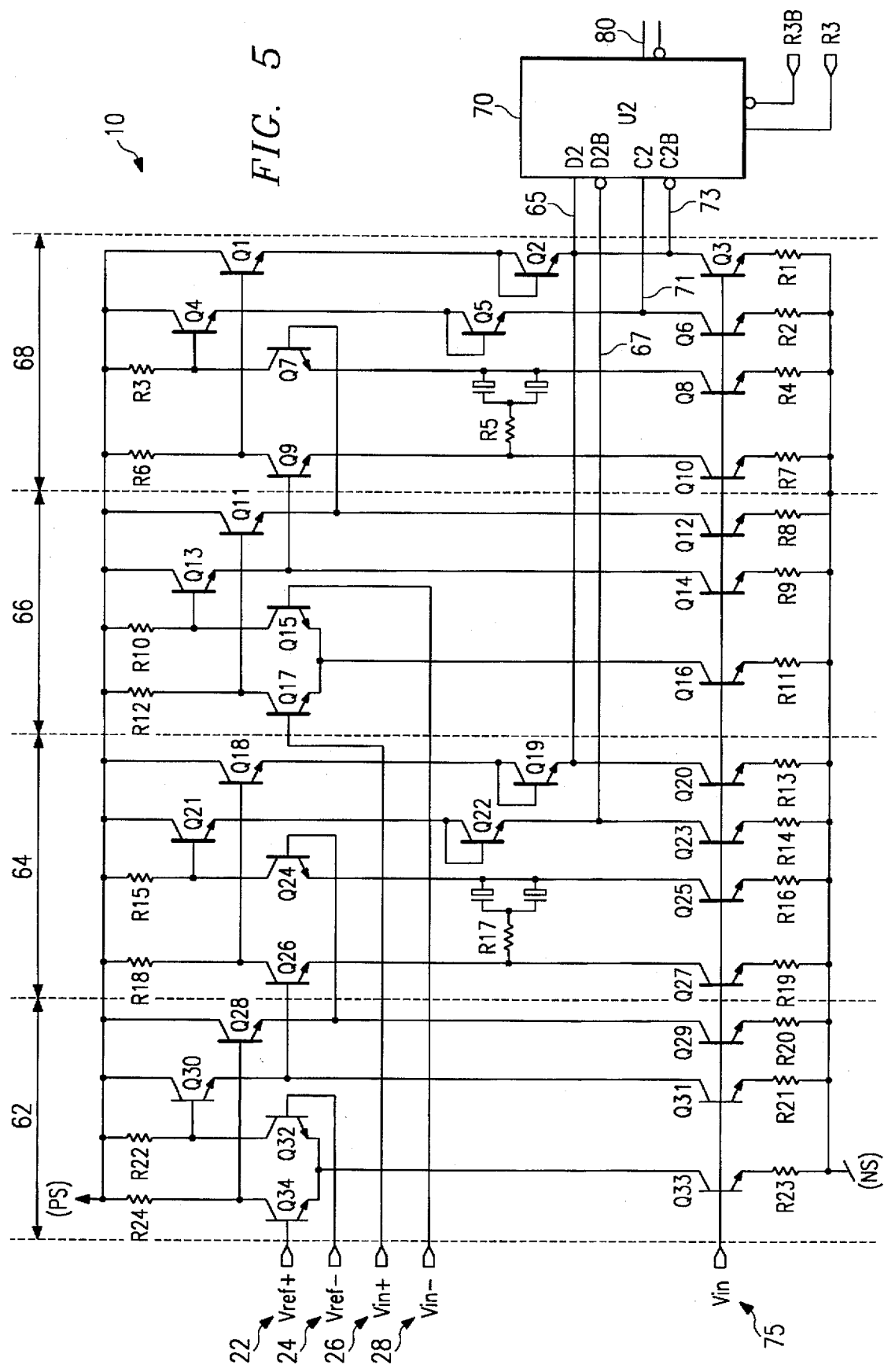
FIG. 5 is a detailed illustration of an implementation of the invention's reference signal and input signal differentiators.

FIG. 5 is an example of detailed implementation of differential amplifiers 62 and 66, and differentiators 64 and 68 in ECL (Emitter Coupled Logic). Output latch 70 is still shown in block diagram (the detailed implementation of output latch 70 is shown in FIG. 6). Referring to FIG. 5, reference signals Vref+ (22) and Vref− (24) are provided to differential amplifier 62. As shown, differential amplifier 62 comprises transistors Q28 through Q34 and resistors R20 through R24. Transistors Q34 through Q32, and resistors R22 through R24 provide a differential ECL amplifier as is well known in the art. Transistors Q28 through Q31 and resistors R21 and R20 provide a low impedance emitter follower output, also well known in the art. A bias voltage Vbn (75) is provided to bias transistors Q33, Q31, and Q29 as shown in FIG. 5.

The differential output of differential amplifier 62 is coupled to reference signal differentiator 64 as shown in FIG. 5. Reference signal differentiator 64 comprises transistors Q18 through Q27, and resistors R19 through R13. Transistor Q24 and resistor R15 determine the gain of the differentiator at output D2B (67), while transistor Q26 and resistor R18 determine the gain of differentiator at output D2 (65). Transistor Q21 provides a low impedance emitter follower output. The output of transistor Q21 undergoes a diode voltage drop through transistor Q22. This diode drop properly sets the voltage level of output D2B (67) before being fed to output latch 70. With respect to output D2 (65), transistor Q18 provides a low impedance emitter follower output. The output of transistor Q18 undergoes a diode drop in voltage through transistor Q19. This diode drop properly sets the voltage level of output D2 (65) before being fed to output latch 70. Differentiator 64 behaves as a high-pass filter with a "corner frequency" below which the gain of differentiator 64 (either at output D2B or D2) drops to a very low value. The "RC" circuit comprising R17, C3, and C4 determines this corner frequency of reference signal differentiator 64. Transistors Q27, Q25, Q23, and Q20, and resistors R19, R16, R14, and R13 provide the proper bias condition for reference signal differentiator 64. Bias voltage Vbn (75) provides the proper bias for transistors Q27, Q25, Q23, and Q20 as shown in FIG. 5.

Input signals Vin+ (26) and Vin− (28) are provided to differential amplifier 66. As shown, differential amplifier 66 comprises transistors Q11 through Q17 and resistors R8 through R12. Transistors Q15 through Q17, and resistors R20 through R12 provide a differential ECL amplifier as is well known in the art. Transistors Q11 through Q14 and resistors R8 and R9 provide a low impedance emitter follower output, also well known in the art. Bias voltage Vbn (75) is used to bias transistors Q16, Q14, and Q12 for proper operation.

The differential output of differential amplifier 66 is coupled to input signal differentiator 68 as shown in FIG. 5. Reference signal differentiator 68 comprises transistors Q1 through Q10, and resistors R1 through R7. Transistor Q7 and resistor R3 determine the gain of the differentiator at output C2 (71), while transistor Q9 and resistor R6 determine the gain of differentiator at output C2B (73). Transistor Q4 provides a low impedance emitter follower output. The output of transistor Q4 undergoes a diode voltage drop through transistor Q5. This diode drop properly sets the voltage level of output C2 (71) before being fed to output latch 70. With respect to output C2B (73), transistor Q1 provides a low impedance emitter follower output. The output of transistor Q1 undergoes a diode drop in voltage through transistor Q2. This diode drop properly sets the voltage level of output C2B (73) before being fed to output latch 70. Differentiator 68 behaves as a high-pass filter with a "corner frequency" below which the gain of differentiator 68 (either at output C2B or C2) drops to a very low value. The "RC" circuit comprising R5, C1, and C2 determines this corner frequency of reference signal differentiator 68. Transistors Q10, Q8, Q6, and Q3, and resistors R7, R4, R2, and R1 provide the proper bias condition for reference signal differentiator 68. Bias voltage Vbn (75) provides the proper bias for transistors Q10, Q8, Q6, and Q3 as shown in FIG. 5.

From basic circuit theory it can be shown that the transfer function for the reference signal path is:

$$F_{ref}(s) = A_v(s) \cdot A_{diff}(s) \quad (1)$$

where $$A_v(s) = \text{gain of differential amplifier } 62 = -g_{m_{Q24}} R_{24} \quad (2)$$

and $$A_{diff}(s) = \text{gain of reference signal differentiator } 64 = g_{m_{Q24}} R_{15}/[1 + g_{m_{Q24}}(sR_{17}C_a + 1)/2sC_a] \quad (3)$$

where $C_a = C_3 + C_4$.

Substituting for $A_v(s)$ and $A_{diff}(s)$, equation (1) can now be expressed as:

$$F_{ref}(s) = 2g_{m_{Q24}} R_{24}(sR_{15}C_a)/[sC_a(R_{17} + 2/g_{m_{Q24}}) + 1] \quad (4)$$

Since transconductance $g_{m_{Q24}}$ of transistor Q24 is very large, $2/g_{m_{Q24}}$ is negligible as compared with R17. Accordingly, from the transfer function shown in equation (4), we can see that the "corner frequency" of reference signal differentiator 64 can be approximated as:

$$f_a = 1/2\pi R_{17} C_a \quad (5)$$

In like manner, the transfer function for the input signal path is equal to:

$$F_{in}(s) = 2g_{m_{Q17}} R_{12}(sR_5 C_b)/[sC_b(R_5 + 2/g_{m_{Q7}}) + 1] \quad (6)$$

where $C_b = C_1 + C_2$.

Since transconductance $g_{m_{Q7}}$ of transistor Q7 is very large, $2/g_{m_{Q7}}$ is negligible as compared with R5. Accordingly, from the transfer function shown in equation (6), we can see that the "corner frequency" of input signal differentiator 68 can be approximated as:

$$f_b = 1/2\pi R_5 C_b \quad (7)$$

The transfer functions for both the reference signal path (i.e., $F_{ref}(s)$) and the input signal path (i.e., $F_{in}(s)$) are transfer functions for a "high-pass" filter. Accordingly, the "corner frequency" ($f_a = 1/2\pi R_{17} C_a$) of reference signal differentiator 64 is a frequency below which the gain of differentiator 64 is very small. Thus, signals with frequencies below $f_a = 1/2\pi R_{17} C_a$ are suppressed, and only signals above the corner frequency $f_a = 1/2\pi R_{17} C_a$ pass through reference signal differentiator 64. Likewise, the corner frequency ($f_b = 1/2\pi R_5 C_b$) of input signal differentiator 68 is a frequency below which the gain of differentiator 68 is very small. Thus, signals with frequencies below $f_b = 1/2\pi R_5 C_b$ are suppressed, and only signals above the corner frequency $f_b = 1/2\pi R_5 C_b$ pass through input signal differentiator 68.

In the case of a 180 degree phase detector (shown in FIG. 5), the high-pass corner frequency of both differentiator 64 and differentiator 68 is set below the reference and input signal frequencies. This is done so that the frequencies of interest pass through the differentiators' high pass filters. However, the high pass corner frequency is set high enough such that DC and low frequency offsets present in reference signal (Vref+ or Vref−) or input signal (Vin+ or Vin−) are suppressed. Thus, signals D2, D2B, C2 and C2B provided to output latch 70 do not contain a DC or low frequency offset component. Accordingly, the phase relationship between the reference signal (Vref+ or Vref−) and input signal (Vin+ or Vin−) is accurately measured. In accordance with the invention, the corner frequencies ($f_a = 1/2\pi R_{17} C_a$ and $f_b = 1/2\pi R_5 C_b$) are adjusted to desired values by simply adjusting the values of capacitors $C_a$ (i.e., C3+C4) and $C_b$ (i.e., C1+C2).

The present invention's output latch 70 is shown in detail in FIG. 6. Signals D2B (67) and D2 (65) are provided to D flip flop 85, while signals C2B (73) and C2 (71) are provided to D flip flop 87 as shown. The flip flops as embodied in the present invention have differential clock and reset inputs. Differential flip flops are preferred due to good noise immunity. However, those skilled in the art recognize that single input flip flops can be used instead of the differential flip flops. Reset signals R3 (81) and R3B (83) are also coupled to both D flip flop 85 and D flip flop 87. Output 89 (Q1B) of D flip flop 85 is coupled to NOR gate 93. Similarly, output 91 (Q2B) of D flip flop 87 is coupled to NOR gate 95. D flip flop 85 and D flip flop 87 are configured such that the D inputs are connected to logic "One." Accordingly, the output of the flip flops will change dependent upon the state of the reset inputs R3 and R3B when the C2 input transitions from low to high and C2B from high to low. For example, output Q1B (89) of D flip flop 85 is set low when D2 transitions from low to high and reset (R3) is low.

NOR gate 93 and NOR gate 95 are cross-coupled as shown in FIG. 6. Output 97 (Set) of NOR gate 93 is coupled to AND gate 92, while output 99 (Reset) of NOR gate 95 is coupled to AND gate 96. A second input to AND gate 92 is R3B (83), while a second input to AND gate 96 is also R3B (83). The output of AND gate 92 is coupled to NOR gate 94, while the output of AND gate 96 is connected to NOR gate

98. NOR gate 94 and NOR gate 98 are cross-coupled as shown. Either output 90 (O3B) of NOR gate 94 or output 80 (O3) of NOR gate 98 can be used as output of latch 70. Output of latch 70 (either O3 or O3B) is also output of phase detector 10 of the present invention.

Latch 70 (shown in FIG. 6) eliminates the race and metastable conditions common to prior art phase detectors through the use of a novel three stage latching circuit. In addition, symmetrical delay paths eliminate timing skews in the reference and input signal paths so that output O3 (or O3B) is an accurate indication of the phase difference between the reference signal represented by D2 (or D2B) and the input signal represented by C2 (or C2B). In operation, a positive transition of reference signal D2 will set D flip flop 85, whose state will remain unchanged until the reset signal R3 is asserted high. Likewise, a positive transition of input signal C2 will set D flip flop 87 which will remain in that state until the reset signal R3 is asserted high. In one implementation of this embodiment of the invention, reset signal R3 is asserted high 90 degrees after a positive transition of the reference signal D2 (or D2B).

Suppose that reference signal D2 transitions high while reset signal R3 is low. This will set D flip flop 85 which to go in turn cause the "false" output to go low. In other words, a high at D2 while R3 is low causes Q1B (89) to transition low. Referring to FIG. 7, waveforms 65, 81, and 89 illustrates this condition. When, 90 degrees after assertion of D2, reset signal R3 is asserted high, Q1B (89) is forced high as shown in FIG. 7. Likewise, output of D flip flop 87 follows the transitions of input reference signal C2 (71) while reset signal R3 is low. For example, as shown in FIG. 7, when C2 (71) is low, output of D flip flop 87 is low (or the "false" output Q2B (91) is high) even though R3 is not yet asserted. When C2 is asserted high, Q2B (91) is forced low as shown in FIG. 7. When, 90 degrees after assertion of D2, reset signal R3 is asserted high, Q2B (91) is forced back high as shown in FIG. 7.

NOR gate 93 will force output 97 ("Set") high when Q1B and output of NOR gate 95 ("Reset" (99)) are both low as shown in FIG. 7. Output 97 of NOR gate 93 is forced low when Q1B is asserted high by D flip flop 85. Meanwhile output of NOR gate 95 ("Reset")is forced low and remains low as long as either Q2B or output of NOR gate 93 is high. As shown in FIG. 7, Reset (99) remains low until the third positive transition of input signal C2 which causes Q2B to go low while output of NOR gate 93 ("Set") is still low. Output 99 ("Reset") of NOR gate 95 is ANDed with signal R3B and provided to NOR gate 98. Thus, AND gate 96 provides a low signal to NOR gate 98 while Reset 99 remains low. Similarly, AND gate 92 provides a high input to NOR gate 94 when both output of NOR gate 93 ("Set") is high and reset signal R3 is low. Thus, AND gate 92 provides a high signal to NOR gate 92 in response to the first positive transition of signal D2 as shown in FIG. 7. Accordingly, output O3B (90) of NOR gate 94 transitions low in response to the first positive transition of signal D2. Since output of AND gate 96 provided to NOR gate 98 is low, and further since O3B is low, output of NOR gate 98 (O3) is set high in response to the first positive transition of reference signal D2. Signal O3 (80) is also the output of phase detector 10. A logic "one" at signal O3 means that the phase difference between reference signal D2 and input signal C2 is greater than 180 degrees. As shown in FIG. 7, signal O3 remains at logic "one" until phase of input signal C2 changes such that the phase difference between reference signal D2 and input signal C2 becomes less than 180 degrees. At this point, shown in FIG. 7 as the third positive transition of input signal C2, signal O3 is forced low.

Figure 8:
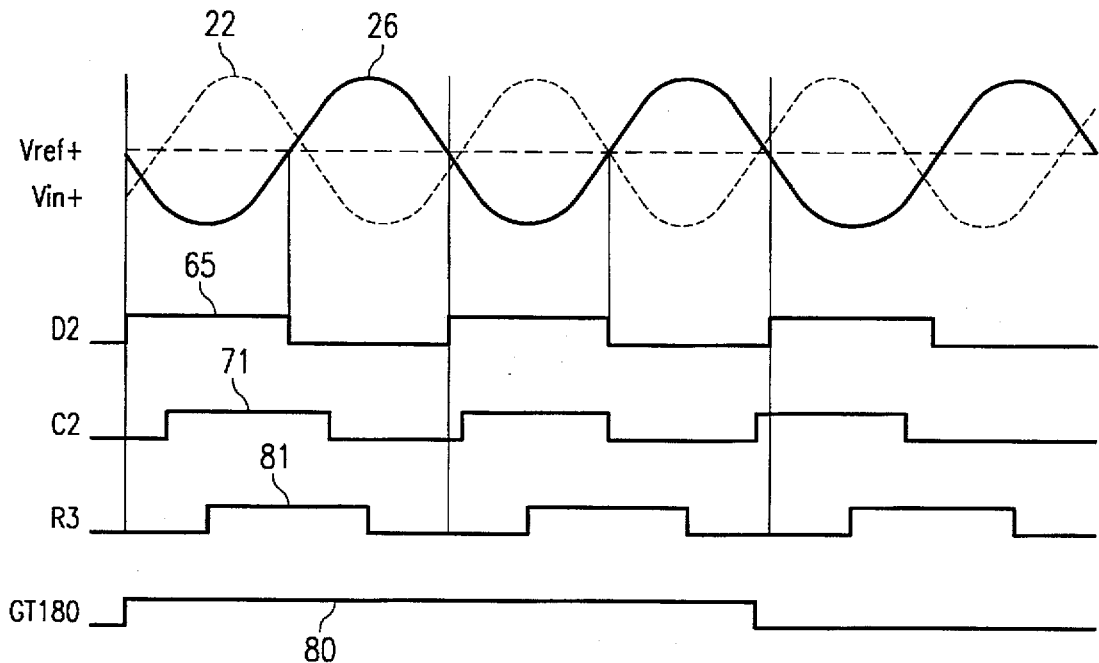
FIG. 8 illustrates the relationship of the reference signal and the input signal with signal waveforms of the phase detector of the invention where n=2.

Output latch 70 presents a symmetrical delay paths to reference signal D2 and input signal C2. This is because the logic elements by means of which the phases of reference signal D2 and input signal C2 are compared are identical. Furthermore, reference signal Vref+ (or Vref−) and input signal Vin+ (or Vin−) also traverse through a symmetrical delay path before generating signal D2 and signal C2. Accordingly, the delay experienced by reference signal Vref+ (or Vref−) and input signal Vin+ (or Vin−) is identical through the differential amplifiers, the signal differentiators, and the output O3 (or O3B) of the output latch. Thus, the invention overcomes the prior art disadvantage of timing skews which result in an erroneous determination of the phase relationship between an input signal and a reference signal. FIG. 8 illustrates the relationship between the input and reference signals on the one hand, and signals D2 and C2 on the other. FIG. 8 is similar to FIG. 7 except that FIG. 8 shows the relationship between reference signal Vref+ 22 and input signal Vin+ 26 to signals D2 and C2 respectively. In FIG. 8, output 80 of NOR gate 98 (O3) is denoted as GT180.

The invention just described has a number of other embodiments. For example, although the invention was described for an n=2 condition, the invention is equally applicable to an n=1, 3, or 4 condition. In fact one of the advances of the invention over the prior art is that with minor and easy adjustments the phase detector of the invention can become a $\pi/2$, $\pi$, $3\pi/2$, or $2\pi$ phase detector. For example, the phase detector of the present invention can be easily adapted to detect whether the difference between the phase of an input signal and that of a reference signal is greater or less than 90 degrees (in which case n=1). This is accomplished by simply increasing the high-pass corner frequency of reference signal differentiator 64 to an appropriate value above the signal frequency. This allows true differentiation of the signal peaks while maintaining the DC offset and low frequency blocking capability necessary for accurate phase detection.

Figure 9:
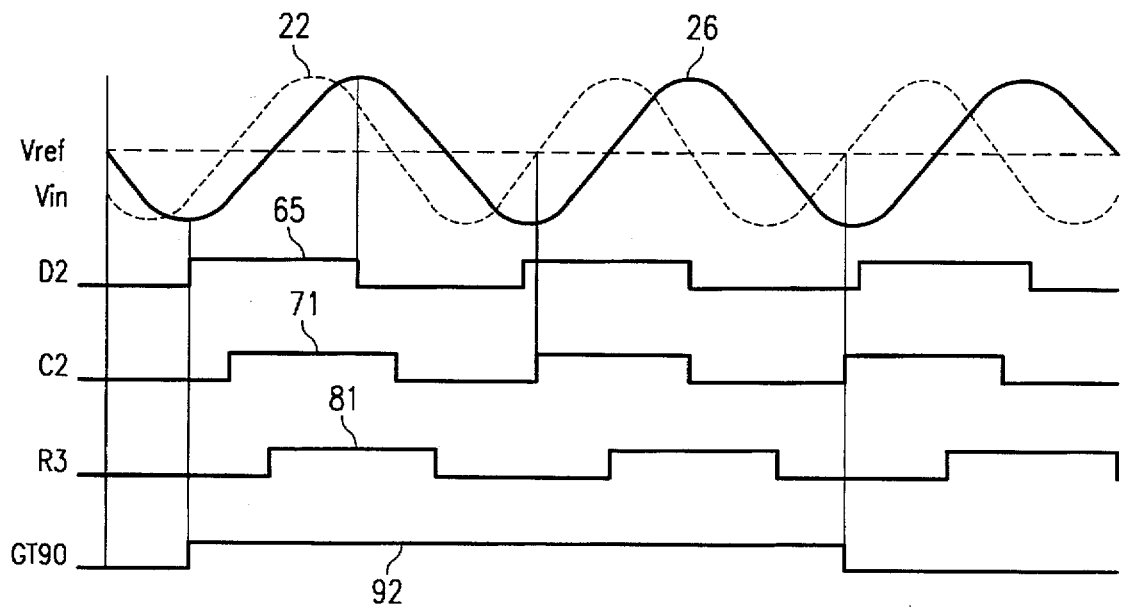
FIG. 9 illustrates the relationship of the reference signal and the input signal with signal waveforms of the phase detector of the invention where n=1.

Differentiation of the signal peaks serves to indicate the quadrature phase points of the reference signal. This in turn allows an evaluation of whether the difference between the phase of an input signal and a reference signal is greater or less than 90 degrees. As before, the high-pass corner frequency of reference signal differentiator 64 of the present invention is adjusted by a simple change of the capacitor values. Thus, to increase the high-pass corner frequency of reference signal differentiator 64 ($f_a = 1/2\pi R_{17} C_a$), capacitor Ca is decreased in value. FIG. 9 shows how the phase detector of the present invention compares a reference signal (Vref 22) with an input signal (Vin 26) in order to determine whether the difference between the phase of the reference signal and the phase of the input signal is greater or less than 90 degrees. Output of the phase detector (GT90) is forced high when this phase difference is greater than 90 degrees. Conversely, GT90 is forced low when the phase difference is less than 90 degrees as shown in FIG. 9.

Although the invention has been described with reference to a preferred embodiment, it is appreciated by those skilled in the art that changes in various details may be made without departing from the invention defined in the appended claims.

Thus, a precision phase detector has been described.

I claim:

1. A phase detector comprising:

a reference differentiator coupled to a reference signal having a reference phase, said reference differentiator having means for blocking DC offset and low frequency signals;

an input differentiator coupled to an input signal having an input phase, said input differentiator having means for blocking DC offset and low frequency signals;

a latch coupled to said input differentiator and to said reference differentiator; and said latch having a latch output indicating the difference between said reference phase and said input phase.

2. The phase detector of claim 1 wherein said reference differentiator blocks DC offsets in said reference signal.

3. The phase detector of claim 1 wherein said reference differentiator blocks frequencies below a frequency of said reference signal.

4. The phase detector of claim 1 wherein said input differentiator blocks DC offsets in said input signal.

5. The phase detector of claim 1 wherein said input differentiator blocks frequencies below a frequency of said input signal.

6. The phase detector of claim 1 wherein a delay path of said reference signal is substantially equal to a delay path of said input signal.

7. The phase detector of claim 1 wherein a delay path of said reference signal is equal to a delay path of said input signal.

8. The phase detector of claim 1 wherein said reference signal traverses a first delay path beginning in said reference differentiator and ending in said latch, and wherein said input signal traverses a second delay path beginning in said input differentiator and ending in said latch, wherein said first and second delay paths are substantially equal.

9. The phase detector of claim 8 wherein said first and second delay paths are equal.

10. A phase detector having means for blocking DC offsets in reference and input signals, said reference and input signals being coupled to an output latch wherein a delay path in said output latch comprises a NOR gate and a cross-coupled latch, said output latch thereby causing delays experienced by said reference and input signals to be substantially equal.

11. The phase detector of claim 10 wherein said delay paths experienced by said reference and input signals are equal.

12. The phase detector of claim 10 whereby metastable conditions in said phase detector are eliminated.

* * * * *